(12) United States Patent
Barevadia et al.

(10) Patent No.: US 7,120,842 B2
(45) Date of Patent: Oct. 10, 2006

(54) MECHANISM TO ENHANCE OBSERVABILITY OF INTEGRATED CIRCUIT FAILURES DURING BURN-IN TESTS

(75) Inventors: Gordhan Barevadia, Richardson, TX (US); Anupama Aniruddha Agashe, Pune (IN); Nikila Krishnamoorthy, Bangalore (IN); Rubin Ajit Parekhji, Bangalore (IN); Neil J. Simpson, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 428 days.

(21) Appl. No.: 10/667,879

(22) Filed: Sep. 22, 2003

(65) Prior Publication Data

US 2005/0066243 A1  Mar. 24, 2005

(51) Int. Cl.
*G01R 31/28* (2006.01)

(52) U.S. Cl. .................................... 714/726; 714/733
(58) Field of Classification Search ................ 365/201
See application file for complete search history.

(56) References Cited

U.S. PATENT DOCUMENTS

| | | | |
|---|---|---|---|
| 6,535,440 B1 * | 3/2003 | Lim et al. .................... | 365/201 |
| 6,675,338 B1 * | 1/2004 | Golshan ...................... | 714/739 |
| 6,950,974 B1 * | 9/2005 | Wohl et al. .................. | 714/733 |
| 2003/0149913 A1 * | 8/2003 | Balachandran et al. ....... | 714/30 |
| 2003/0167426 A1 * | 9/2003 | Slobodnik .................... | 714/718 |

* cited by examiner

*Primary Examiner*—Phung My Chung
(74) *Attorney, Agent, or Firm*—Steven A. Shaw; W. James Brady; Frederick J. Telecky, Jr.

(57) ABSTRACT

A system and method enhance observability of IC failures during burn-in tests. Scan automatic test pattern generation and memory built-in self-test patterns are monitored during the burn-in tests to provide a mechanism for observing selective scan chain outputs and memory BIST status outputs.

15 Claims, 1 Drawing Sheet

MECHANISM TO ENHANCE OBSERVABILITY OF INTEGRATED CIRCUIT FAILURES DURING BURN-IN TESTS

BACKGROUND OF THE INVENTION

1. Field of the Invention

This invention relates generally to semiconductor integrated circuit (IC) burn-in testing, and more particularly to a technique for enhancing observability of IC failures during burn-in tests.

2. Description of the Prior Art

Burn-in testing for a semiconductor integrated circuit (IC) device is carried out to eliminate weak devices that are most likely to fail during early life of the product. The test is performed within a burn-in oven by placing multiple devices on a burn-in board at typically a 125 degrees Centigrade (C) temperature and by applying a higher voltage than the normal operating voltage to the device. Due to these extreme stress conditions, weak devices may show failures. To detect these failures during the test itself, the device functionality can be monitored. Depending upon the complexity of the device, the burn-in board configuration and the burn-in oven, only a limited number of devices can be burned-in at the same time. In a complex device, there are several outputs that require monitoring. With limited pin monitoring capability of the oven, monitoring several pins of multiple devices on a board becomes very challenging. In most cases, there are only one or two device pins that can be monitored by the oven. Such limitations regarding observability prevent any substantial scope of fault isolation. On the other hand, observability of failures helps burn-in hardware/software debug during IC development. During the actual burn-in process, the monitoring signal capability helps in eliminating the failing device(s) and is also useful in generating failure statistics for a particular device or process.

In view of the foregoing, it would be both beneficial and advantageous to provide a technique to enhance observability of IC failures during burn-in tests beyond that presently known in the burn-in testing art while adhering to the limitations described herein before.

SUMMARY OF THE INVENTION

The present invention is directed to a technique for enhancing observability of IC failures during burn-in tests. Scan ATPG (Automatic Test Pattern Generation) and memory BIST (Built In Self Test) patterns are monitored during the burn-in tests to provide a mechanism for observing selective scan chain outputs and memory BIST status outputs.

A burn-in stimulus is applied to the device under test through scan channels. The outputs of all the scan chains are combined into a monitor output using an Ex-OR logic cone which is brought out at the device level. A mechanism is provided to select a particular set of one or more scan chains to be driven into the Ex-OR cone. Further, the memory BIST status signals (combined output derived from the Fail/Go-NoGo or other such status signals of all active controllers) and the DieID scan chain output are also selectively enabled to drive the monitor output through the Ex-OR cone. This process is advantageous in that it 1) provides the desired visibility and 2) enhances the scope for fault isolation during burn-in process.

In one aspect of the invention, a technique is provided that allows for increased diagnostibility in the presence of Ex-OR logic beyond that presently available using known Ex-OR approaches to generate monitored outputs.

In another aspect of the invention, a technique is provided that generates patterns with potentially greater coverage than that presently achievable using known Ex-OR approaches to generate monitored outputs.

According to one implementation) of the invention, a test system comprises:

a burn-in configuration register;

combinational logic operational in response to IC Die identification (ID) scan out data and burn-in configuration register data (enable) to generate Die ID scan signals;

means operational in response to memory BIST status data and burn-in configuration register data (enable) for generating memory BIST signals;

means operational in response to scan chain data and burn-in configuration register data (enable) to generate scan chain signals; and exclusive-OR logic operational in response to the die ID scan signal, memory BIST signal, and scan chain signals to generate monitored output signals.

According to another implementation of the invention, a test system comprises:

means for configuring the test system;

means for generating memory built-in self-test (BIST) signals;

means for generating scan chain signals;

means for generating die identification (ID) scan out signals; and exclusive-OR logic operational in response to the die ID scan out signals, memory BIST signals, and scan chain signals to generate monitored output signals.

According to yet another implementation of the invention, a method of observing integrated circuit (IC) failures during burn-in testing comprises the steps of:

monitoring scan automatic test pattern generation (ATPG) and memory built-in self-test (BIST) patterns; and selecting desired scan chain outputs and memory BIST status outputs to generate monitored IC output signals.

BRIEF DESCRIPTION OF THE DRAWINGS

Other aspects and features of the present invention and many of the attendant advantages of the present invention will be readily appreciated, as the invention becomes better understood by reference to the following detailed description when considered in connection with the accompanying drawing FIGURE wherein:

The FIG. 1 is a block diagram illustrating a mechanism for enhancing observability of integrated circuit failures during burn-in testing according to one embodiment of the present invention.

Figure 1:
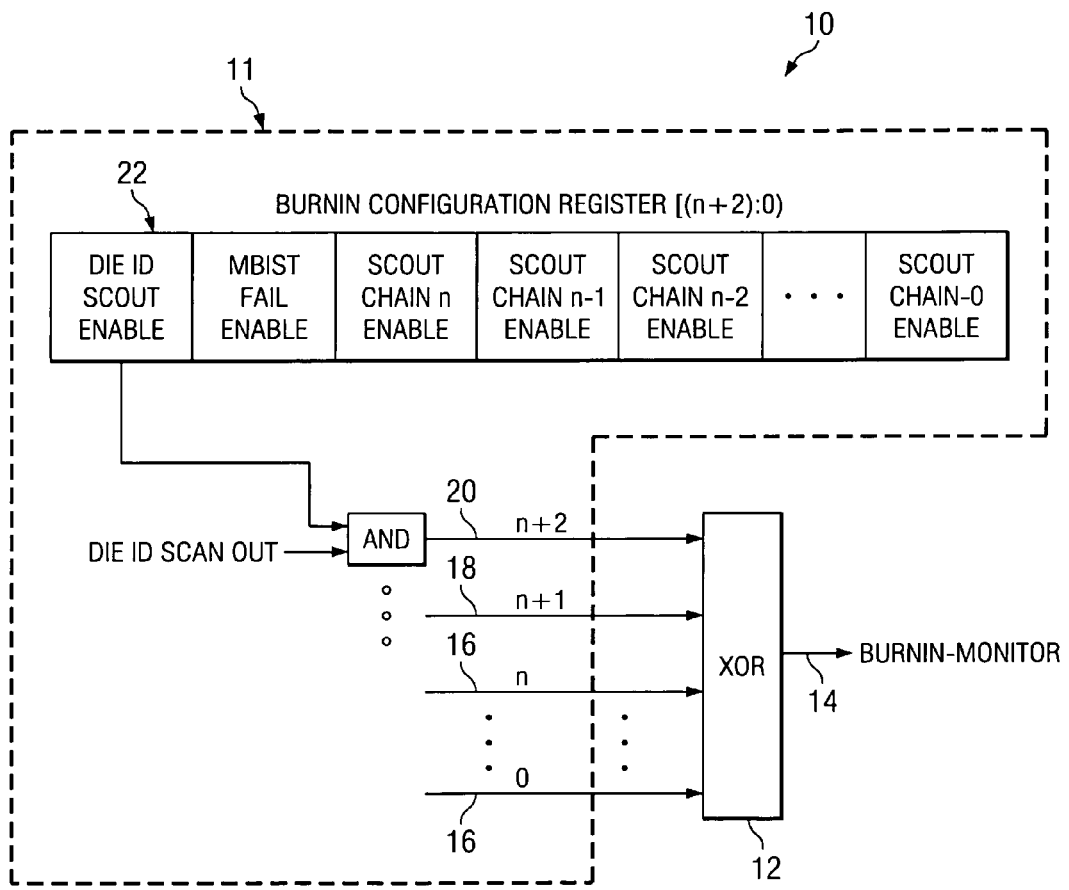

While the above-identified drawing FIGURE sets forth a particular embodiment, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The Ex-OR approach to generate a monitored output during integrated circuit burn-in testing is known, as stated herein before. The present inventors recognized that this known approach however, is disadvantageous in that it increasingly limits the scope of fault isolation as the desired number of devices under test increases, and therefore the available number of monitor outputs decreases.

Looking now at the FIG. 1, a block diagram illustrates a system 10 for enhancing observability of integrated circuit failures during burn-in testing according to one embodiment of the present invention. The system 10 consists of n+2 AND gates (only one AND gate is depicted in the FIGURE), a configuration register 22 of n+2 width, and a single XOR gate 12. The present inventors alone realized a selection mechanism (sub-system) 11 for individual scan chain 16 and memory built-in self-test (BIST) status 18 outputs to implement this system 10.

The implementation shown in the FIGURE can be more precisely described as follows:
  wire scan_out_xor=(scan_out[n:0] & burn_cfg_reg[n:0]);
  wire mbist_xor=(mbist_fail_xor & burn_cfg_reg[n+1]);
  wire dieid_xor=(scout_die_id & burn_cfg_reg[n+2]);
  wire burnin_monitor=scan_out_xor^mbist_xor^dieid_xor.

System 10 can be seen to also employ the well-known Ex-OR scheme 12 based monitoring. It is the selection mechanism 11 however, that distinguishes the present invention from the known Ex-OR monitoring scheme 12. The Ex-OR based monitoring scheme 12 is still used for exporting scan as well as other test status signals. Such diagnosis is however facilitated by using the present selection mechanism 11, without affecting the Ex-OR scheme 12 in any way. One or more scan chains 16, for example, can be selected for specific diagnostics. Such a diagnostic mode facilitates debug in the burn-in environment, where the failure(s) can be isolated without corrupting the Ex-OR output 14.

Besides being able to provide such a diagnostic mode, it is now not necessary to support multiple burn-in modes for different tests, e.g. for different groups of scan chains 16. Further, existing burn-in test description languages (TDLs) for different intellectual property (IP) can also be re-used, by disabling unused scan chains 16, without having to re-generate them in the full device context. The mechanism 11 of selecting/de-selecting a particular scan chain 16, for example, will aid in reusing existing burn-in TDLs for a particular IP and in debugging any silicon failures for a particular IP.

Since the number of scan chains 16 feeding the XOR logic 12 can be selected, it is now possible to target generation of burn-in patterns in an intelligent manner. The burn-in tester memory however, imposes a limit on the number of test patterns that can be applied. Assume for example, that the number of patterns that can be applied is N and the total number of scan chains 16 is M. It is now possible to target automatic test pattern generation (ATPG) to provide greater coverage with N1+N2 patterns, (N1+N2=N), such that N1 patterns are generated with C1 scan chains 16, and N2 patterns with C2 scan chains 16, (C1+C2=C). The present invention is not so limited however, and it shall be understood this scheme can similarly be extended to more than two groups of scan chains 16 and more than two set of patterns.

In summary explanation, a technique is provided for enhancing observability of IC failures during burn-in tests. Scan ATPG 16 and memory BIST 18 patterns are monitored during the burn-in tests to provide a mechanism for observing selective scan chain outputs and memory BIST status outputs.

A burn-in stimulus is applied to the device under test through scan channels. The outputs of all the scan chains are combined into a monitor output 14 using an Ex-OR logic cone 12 which is brought out at the device level. A mechanism 11 is provided to select a particular set of one or more scan chains 16 to be driven into the Ex-OR cone 12. Further, the memory BIST status signals 18 (Ex-OR of the Fail/Go-NoGo signals of all active controllers) and the DieID scan chain output signals 20 are also selectively enabled to drive the monitor output 14 through the Ex-OR cone 12. As stated herein before, this process is advantageous in that it 1) provides the desired visibility and 2) enhances coverage during the burn-in process.

In view of the above, it can be seen the present invention presents a significant advancement in the art of IC burn-in technology. Further, this invention has been described in considerable detail in order to provide those skilled in the IC burn-in test art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

For example, although various embodiments have been presented herein with reference to particular functional architectures and characteristics, the present inventive structures and characteristics are not necessarily limited to particular detection circuit architectures or sets of characteristics as used herein. It shall be understood the embodiments described herein above can easily be implemented using diverse combinations of combinatorial elements so long as the combinations achieve desired results according to the inventive principles set forth herein above.

What is claimed is:

1. A test system comprising:
   a burn-in configuration register;
   combinational logic operational in response to IC Die identification (ID) scan data and burn-in configuration register data to generate Die ID scan out signals;
   means for generating memory built-in self-test (BIST) signals;
   means for generating scan chain signals; and
   exclusive-OR logic operational in response to the Die ID scan out signals, memory BIST signals, and scan chain signals to generate monitored output signals.

2. The test system according to claim 1, wherein the burn-in configuration register comprises:
   a Die ID Scout Enable register;
   a plurality of Scout Chain Enable registers, and
   a Memory BIST status enable register.

3. The test system according to claim 1, wherein the combinational logic comprises AND logic.

4. A test system comprising:
   means for configuring the test system;
   means for generating Die identification (ID) scan out signals;
   means for generating memory built-in self-test (BIST) signals;
   means for generating scan chain signals; and
   exclusive-OR logic operational in response to the Die ID scan out signals, memory BIST signals, and scan chain signals to generate monitored output signals.

5. The test system comprising according to claim 4, wherein the means for configuring the test system comprises a burn-in configuration register.

6. The test system comprising according to claim 5, wherein the means for generating Die ID scan out signals comprises combinational logic operational in response to IC Die identification (ID) scan out data and burn-in configuration register data to generate the Die ID scan out signals.

7. The test system according to claim 6, wherein the combinational logic comprises AND logic.

8. The test system according to claim 5, wherein the burn-in configuration register comprises:
 a Die ID Scout Enable register; and
 a plurality of Scout Chain Enable registers.

9. The test system according to claim 8, wherein the burn-in configuration register further comprises a memory built-in self-test (MBIST) Fail Enable register.

10. A method of testing integrated circuit failures on a test system comprising:
 configuring test system;
 generating Die identification (ID) scan out signals;
 generating memory built-in self-test (BIST) signals;
 generating scan chain signals; and
 generating monitored output signals, wherein the monitored output signals are generated using exclusive-OR logic operation in response to the Die ID scan out signals, memory BIST signals, and scan chain signals.

11. A method according to claim 10, wherein configuring the test system comprises configuring a burn-in configuration register.

12. A method according to claim 11, wherein the Die ID scan out signals are generated by a combinational logic operational in response to IC Die identification (ID) scan out data and burn-in configuration register data.

13. A method according to claim 12, wherein the combinational logic comprises AND logic.

14. A method according to claim 11, wherein the burn-in configuration register comprises:
 a Die ID Scout Enable register; and
 a plurality of Scout Chain Enable registers.

15. A method according to claim 14, wherein the burn-in configuration register further comprises a memory built-in self-test (MBIST) Fail Enable register.

* * * * *